(12) United States Patent
Kim

(10) Patent No.: US 7,528,626 B2
(45) Date of Patent: May 5, 2009

(54) SEMICONDUCTOR MEMORY DEVICE WITH ZQ CALIBRATION CIRCUIT

(75) Inventor: Ki-Ho Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/819,805

(22) Filed: Jun. 29, 2007

(65) Prior Publication Data
US 2008/0001623 A1 Jan. 3, 2008

(30) Foreign Application Priority Data
Jun. 30, 2006 (KR) .................. 10-2006-0061436

(51) Int. Cl.
*H03K 17/16* (2006.01)
(52) U.S. Cl. ........................................ 326/30
(58) Field of Classification Search .............. 326/30, 326/86, 87; 327/108, 109; 333/17.3, 32; 365/189.05, 189.11
See application file for complete search history.

(56) References Cited

U.S. PATENT DOCUMENTS

| 6,515,922 | B1 | 2/2003 | Yamagata |
| 6,809,975 | B2 | 10/2004 | Yamaoka et al. |
| 7,051,130 | B1 | 5/2006 | Horowitz et al. |
| 2007/0200591 | A1* | 8/2007 | Kim ............................ 326/30 |
| 2008/0061818 | A1* | 3/2008 | Santurkar et al. ............. 326/30 |
| 2008/0112246 | A1* | 5/2008 | Mei ........................ 365/210.1 |

FOREIGN PATENT DOCUMENTS

| JP | 2001-274323 | 10/2001 |
| JP | 2003-317499 | 11/2003 |
| KR | 10-2004-0083814 | 10/2004 |
| KR | 10-2004-0095912 | 11/2004 |

OTHER PUBLICATIONS

Korean Office Action issued in Korean Patent Application No. KR 10-2007-0065714, mailed Dec. 30, 2008.

* cited by examiner

*Primary Examiner*—Rexford Barnie
*Assistant Examiner*—Jany Tran
(74) *Attorney, Agent, or Firm*—McDermott Will & Emery LLP

(57) ABSTRACT

An impedance adjusting circuit of semiconductor memory devices is able to adjusting its termination resistance stably. The semiconductor memory device includes a reference range supplying unit for supplying a normal target range corresponding to a ZQ resistance and supplying a micro target range in response to a micro target signal, a termination resistance supplying unit for supplying an output resistance corresponding to a plurality of control codes, a code generating unit for generating the plurality of control codes in order to shift the output resistance within the normal target range and for adjusting the plurality of control codes to shift the output resistance within the micro target range in response to the micro target signal, and a normal shift detecting unit for detecting the output resistance arranged within the normal target range to generate the micro target signal.

30 Claims, 13 Drawing Sheets

SEMICONDUCTOR MEMORY DEVICE WITH ZQ CALIBRATION CIRCUIT

CROSS-REFERENCE TO RELATED APPLICATIONS

The present invention claims priority of Korean patent application number 10-2006-0061436, filed on Jun. 30, 2006, which is incorporated by reference in its entirety.

BACKGROUND OF THE INVENTION

The present invention relates to integrated circuits, more particular, to an impedance adjusting circuit of semiconductor memory devices.

Generally, semiconductor memory devices including integrated circuits such as a microprocessor, a memory circuit and gate array circuits are used for various electrical appliances, e.g., a personal computer, a server computer and a workstation. The semiconductor memory devices typically include a receiving circuit for receiving signals through input pads from the external and an output circuit for outputting internal signals to the external through output pads. The input/output pads may be connected to a transmission line on a printed circuit board (PCB) on which the semiconductor memory devices are arranged.

An output impedance of an input pad of the receiving circuit should match with an impedance of the transmission line connected to the input pad. It is not until the impedance of the input pad of the receiving circuit matches with the impedance of the transmission line that an input signal transferred from the external can be entirely transferred to the receiving circuit without a distortion of the input signal. If the output impedance of the input pad of the receiving circuit mismatches with the impedance of the transmission line, a reflection of the input signal into the receiving circuit occurs. The input signal transferred into the receiving circuit is degraded.

In order to match the impedances of the input pad of the receiving circuit with the impedance of the transmission line, semiconductor memory devices uses a matching circuit such as a chip termination circuit or an on die termination (ODT) circuit. In case of the chip termination circuit, a resistor having a resistance required by the match is provided on a predetermined point between the input pad of the receiving circuit and the transmission line in a PCB. In case of the ODT circuit, the ODT circuit is arranged on a semiconductor die. In other words, a semiconductor memory device includes the ODT circuit.

FIG. 1 shows a schematic diagram of a conventional ZQ calibration circuit in a semiconductor memory device. The conventional ODT circuit includes a reference voltage generating unit 12, a pull-up detecting unit 14, a p-code counting unit 16, a first pull-up resistance adjusting unit 18, a pull-down detecting unit 22, a n-code counting unit 24, a second pull-up resistance adjusting unit 26 and a pull-down resistance adjusting unit 28. A termination resistor ZQ is placed between a node PIN and a ground voltage VSSQ. The reference voltage generating unit 12 generates a reference voltage VREF. The pull-up detecting unit 14 detects a pull-up detecting signal corresponding to a difference between voltage levels of the reference VREF signal and a pull-up resistance adjusting signal PCAL_DQ. The p-code counting unit 16 counts pull-up counting codes PCAL_UP<0:5> up or down in response to the pull-up detecting signal. The pull-up resistance adjusting unit 18 generates the pull-up resistance adjusting signal PCAL_DQ having a voltage level corresponding to the pull-up counting codes PCAL_UP<0:5>.

The pull-down detecting unit 22 generates a pull-down detecting signal corresponding to a difference between voltage levels of the reference signal VREF and a pull-down resistance adjusting signal NCAL_DQ. The n-code counting unit 24 counts pull-down counting codes NCAL_DN<0:5> up or down in response to the pull-down detecting signal. The first pull-down resistance adjusting unit 26 generates a voltage level of the pull-down resistance adjusting signal NCAL_DQ corresponding to the pull-up counting codes PCAL_UP<0:5>. The second pull-down resistance adjusting unit 28 generates a voltage level of the pull-down resistance adjusting signal NCAL_DQ corresponding to the pull-down counting codes NCAL_DN<0:5>.

The p-code counting unit 16 generates the p-code counting codes PCAL_UP<0:5> corresponding to a detecting result of the pull-up detecting unit 14. The pull-up resistance adjusting unit 18 determines the voltage level of the pull-up resistance adjusting signal PCAL_DQ in response to the p-code counting codes PCAL_UP<0:5>. The pull-up detecting unit 14 compares the voltage level of the reference voltage VREF with the voltage level of the pull-up resistance adjusting signal PCAL_DQ to generate the pull-up detecting signal. In detail, the p-code counting unit 16 counts up the p-code counting codes PCAL_UP<0:5> in response to the logic high level of the pull-up detecting signal and counts down the p-code counting codes PCAL_UP<0:5> in response to the logic low level of the pull-up detecting signal. The operation of counting up or counting down the p-code counting codes PCAL_UP<0:5> is continued until the voltage level of the reference voltage VREF and the voltage level of the pull-up resistance adjusting signal PCAL_DQ are the same voltage level.

The first pull-down resistance adjusting unit 26 generates the pull-down resistance adjusting signal NCAL_DQ having a voltage level corresponding to the p-code counting codes PCAL_UP<0:5>. The pull-down detecting unit 22 compares the voltage level of the reference voltage VREF with the voltage level of the pull-down resistance adjusting signal NCAL_DQ to generate the pull-down detecting signal. In detail, the n-code counting unit 24 counts up the n-code counting codes NCAL_DN<0:5> in response to the logic high level of the pull-down detecting signal and counts down the n-code counting codes NCAL_DN<0:5> in response to the logic low level of the pull-down detecting signal. The operation of counting up or counting down the n-code counting codes NCAL_DN<0:5> continues until the voltage level of the reference voltage VREF becomes the same as the voltage level of the pull-down resistance adjusting signal NCAL_DQ. The pull-down resistance adjusting unit 28 generates the pull-down resistance adjusting signal NCAL_DQ having a voltage level corresponding to the n-code counting codes NCAL_DN<0:5>.

For example, assuming that the resistance of the termination resistor ZQ might be 240 ohm and then, the output resistance of the first pull-up resistance adjusting unit 18 is targeted and adjusted as 240 ohm. Thereafter, the output resistance of the second pull-up resistance adjusting unit 26 and the pull-down resistance adjusting unit 28 is adjusted as 240 ohm.

FIG. 2 shows an operation of the conventional ZQ calibration circuit in FIG. 1, especially a bang-bang error. Because of the level limit to adjust the voltage level of the pull-up resistance adjusting signal PCAL_DQ caused by the limit bits of the p-code counting codes PCAL_UP<0:5>, the pull-up resistance adjusting signal PCAL_DQ fluctuates around the level of the reference voltage VREF. That is to say, the voltage level of the pull-up resistance adjusting signal PCAL_DQ can not adjust the level of the reference voltage VREF since the resolution limit of the p-code counting codes PCAL_UP<0:5>. This state is called a bang-bang error.

FIG. 3 shows a schematic diagram of another conventional ZQ calibration circuit in a semiconductor memory device. Especially, in order to remove the fluctuation of the pull-up resistance adjusting signal PCAL_D, the ODT circuit in FIG. 3 is proposed.

Contrary to the ODT circuit in FIG. 1, the ODT circuit in FIG. 3 includes four detection units, i.e., a first pull-up detection unit 32A, a second pull-up detection unit 32B, a first pull-down detection unit 34A and a second pull-down detection unit 34B. The output nodes of the first pull-up detection unit 32A and the second pull-up detection unit 32B are connected to each other. Also, the output nodes of the first pull-up detection unit 32A and the second pull-up detection unit 34B are connected to each other. A reference voltage generating unit 36 generates a first reference voltage VREF_A and a second reference voltage VREF_B. The voltage difference between the first reference voltage VREF_A and the second reference voltage VREF_B is determined as a predetermined target range.

FIG. 4 shows an operation of the ODT in FIG. 3. The first pull-up detection unit 32A compares the voltage level of the first reference voltage VREF_A with the voltage level of the pull-up resistance adjusting signal PCAL_DQ. The second pull-up detection unit 32B compares the voltage level of the second reference voltage VREF_B with the voltage level of the pull-up resistance adjusting signal PCAL_DQ. The voltage level of the pull-up resistance adjusting signal PCAL_DQ is adjusted between the first reference voltage VREF_A and the second reference voltage VREF_B.

If the voltage level of the pull-up resistance adjusting signal PCAL_DQ is higher than those of the first reference voltage VREF_A and the second reference voltage VREF_B, the p-code counting unit counts down the pull-up counting codes PCAL_UP<0:5>. If the voltage level of the pull-up resistance adjusting signal PCAL_DQ is lower than those of the first reference voltage VREF_A and the second reference voltage VREF_B, the p-code counting unit counts up the pull-up counting codes PCAL_UP<0:5>. After the voltage level of the pull-up resistance adjusting signal PCAL_DQ reaches between the first reference voltage VREF_A and the second reference voltage VREF_B, the p-code counting unit stops counting the pull-up counting codes PCAL_UP<0:5>. In that condition, outputs of the first pull-up detection unit 32A and the second pull-up detection unit 32B have an opposite level from each other. The voltage level of the pull-up resistance adjusting signal PCAL_DQ is adjusted between the first reference voltage VREF_A and the second reference voltage VREF_B. Also, the voltage level of the pull-down resistance adjusting signal NCAL_DQ is set between the first reference voltage VREF_A and the second reference voltage VREF_B.

FIG. 5 shows a block diagram of a ZQ calibration circuit in a semiconductor memory device. The ZQ calibration circuit in FIG. 5 includes a ZQ calibration mode controlling unit 42, a ZQ calibration mode detecting unit 44, a calibrating signal generating unit 46, a reference generating unit 60, a p-code generating unit 50, an n-code generating unit 70 and a resistance adjusting unit 80.

The ZQ calibration mode controlling unit 42 receives a reset signal RST, an ZQ-calculating signal ZQC and an address signal TLA<10> to generate a short-period calculating signal ZQCSI and a long-period calculating signal CAL_A. The ZQ calibration mode controlling unit 42 receives a clock CLK5B to generate an internal clock CLKI and an up-data clock UP_DT_CLK. The ZQ calibration mode detecting unit 44 generates an initial-calculating signal ZQCL_INIT in response to an initial transition of the long-period calculating signal CAL_A and generates an external-calculating signal ZQCL_SELF in response to the second transition of the long-period calculating signal CAL_A. The calibrating signal generating unit 46 receives the initial-calculating signal ZQCL_INIT, the external-calculating signal ZQCL_SELF and the short-period calculating signal ZQCSI to periodically generate a calculating signal CAL_OPER and a comparing signal CMP_OPER in synchronization with the internal clock CLKI, respectively. In order to periodically generate a calculating signal CAL_OPER and a comparing signal CMP_OPER, The calibrating signal generating unit 46 includes a timing check circuit which can count periodically. The reference signal generating unit 60 generates a first reference voltage signal VREF_A and a second reference voltage signal VREF_B.

The p-code generating unit 50 generates pull-up calculating codes PCAL_UP<0:5> and pull-up codes PCD_CAL<0:4> in order that the voltage level of a pull-up resistance adjusting signal PCAL_DQ is placed between the first reference voltage signal VREF_A and the second reference voltage signal VREF_B. The n-code generating unit 70 generates pull-down calculating codes NCAL_DN<0:5> and pull-down codes NCD_CAL<0:4> in order that the voltage level of a pull-down resistance adjusting signal NCAL_DQ is placed between the first reference voltage signal VREF_A and the second reference voltage signal VREF_B. The resistance adjusting unit 80 generates the pull-up resistance adjusting signal PCAL_DQ having a voltage level corresponding to the pull-up calculating codes PCAL_UP<0:5> and the pull-down resistance adjusting signal NCAL_DQ having a voltage level corresponding to the pull-down calculating codes NCAL_DN<0:5>.

The ZQ calculating signal ZQC is a control signal for accomplishing a ZQ operation, i.e., ZQ calibration at the JEDEC specification of DDR3 SDRAM. The ZQ calibration by the JEDEC specification of DDR3 SDDRAM has three modes. First mode is to carry out an initial ZQ calibration after a power-up mode at which an external power is supplied at the DDR3 SDRAM. Second mode is to carry out an external-controlled ZQ calibration in response to an external control. Third mode is to carry out a periodic ZQ calibration at every periodic interval, e.g., every 128 ms during operating the DDR3 SDRAM. It takes relatively a long time to carry out the external-controlled ZQ calibration and the initial ZQ calibration in comparison with the periodic ZQ calibration. Then, the external-controlled ZQ calibration and the initial ZQ calibration are called a 'long calibration'. And the periodic ZQ calibration is called a 'short calibration'. For instance, the initial ZQ calibration and the external-controlled ZQ calibration should be carried out within 512 cycles and 256 cycles of an operation clock respectively. The periodic ZQ calibration should be carried out within 64 cycles of the operation clock.

FIG. 6 shows a block diagram of the p-code generating unit in FIG. 5. The p-code generating unit 50 includes a voltage detecting unit 52, a count controlling unit 54 and a p-code counting unit 56. The voltage detecting unit 52 detects whether a voltage level of the pull-up resistance adjusting signal PCAL_DQ is placed between the first reference voltage signal VREF_A and the second reference voltage signal VREF_B and generates comparing signals CMP_OUT/CMP_OUTB and a checking signal HLD. The count controlling unit 54 receives the comparing signal CMP_OUT, the checking signal HLD and the up-data clock UP_DT_CLK to generate a counting enable signal CNT_EN and a counting clock CNT_CLK. The p-code counting unit 56 is enabled in response to the counting enable signal CNT_EN and counts up or down the pull-up calculating codes PCAL_UP<0:5> and the pull-up codes PCD_CAL<0:4> in synchronization with the counting clock CNT_CLK in response to the comparing signal CMP_OUT.

FIG. 7 shows a block diagram of the p-code counting unit in FIG. 6. The p-code counting unit 56 includes six counters 56A to 56F in series. Each of the counters is enabled in response to the counting enable signal CNT_EN and outputs the corresponding pull-up calculating code PCAL_UP and a corresponding carry signal COUT in response to the logic level of an input signal. The first counter 56A receives the comparing signal CMP_OUT as the input signal and the others receive the carry signal COUT from previously counter. The pull-up codes PCD_CAL<0:4>, not shown in FIG. 7, correspond to the pull-up calculating codes PCAL_UP<0:4>, respectively. The pull-up calculating code PCAL_UP<5> is a signal always enabled for an initial operation. Accordingly, the pull-up codes PCD_CAL<0:4> are lower than the pull-up calculating codes PCAL_UP<0:5> by one bit.

The voltage detecting unit 52 detects the voltage level of the pull-up resistance signal PCAL_DQ in comparison with the voltage levels of the first reference voltage signal VREF_A and the second reference voltage signal VREF_B to generate the comparing signal CMP_OUT. If the voltage level of the pull-up resistance adjusting signal PCAL_DQ is higher than those of the first reference voltage VREF_A and the second reference voltage VREF_B, the comparing signal CMP_OUT is outputted as a logic high level. If the voltage level of the pull-up resistance adjusting signal PCAL_DQ is lower than those of the first reference voltage VREF_A and the second reference voltage VREF_B, the comparing signal CMP_OUT is outputted as a logic low level. If the voltage level of the pull-up resistance adjusting signal PCAL_DQ is placed between the first reference voltage VREF_A and the second reference voltage VREF_B, the checking signal HLD is activated. The comparing signal CMP_OUT and the comparing signal CMP_OUTB have an opposite logic level each other.

The count controlling unit 54 activates the counting enable signal CNT_EN in response to the activation of the comparing signal CMP_OUT and generates the counting clock CNT_CLK using the up-data clock UP_DT_CLK. And the count controlling unit 54 inactivates the counting enable signal CNT_EN and stops generating the counting clock CNT_CLK in response to the inactivation of the comparing signal CMP_OUT and the activation of the checking signal HLD. The p-code counting unit 56 outputs the pull-up calculating codes PCD_CAL<0:5> in response to the counting enable signal CNT_EN and the comparing signal CMP_OUT by performing an up or a down counting operation synchronized with the counting clock CNT_CLK.

FIG. 8 shows a schematic diagram of the reference voltage generating unit in FIG. 5. The reference voltage generating unit 60 includes a plurality of resistors in series between a first internal voltage VDDQ and a second internal voltage VSSQ. The first reference voltage VREF_A and the second reference voltage VREF_B are outputted at both terminals of one selected of the plurality of resistors, respectively.

FIG. 9A shows an operation of the ZQ calibration circuit in FIG. 5 in case that the target voltage is relatively narrow. If the target range determined by the first reference voltage VREF_A and the second reference voltage VREF_B is too narrow, the pull-up resistance adjusting signal PCAL_UP and pull-down resistance adjusting signal NCAL_DQ cannot be placed between the first reference voltage VREF_A and the second reference voltage VREF_B within a predetermined time. Because the p-code counting unit 56 counts up or down the pull-up calculating codes PCAL_UP<0:5> too much.

FIG. 9B shows an operation of the ZQ calibration circuit in FIG. 5 in case that the target voltage is relatively wide. If the target range determined by the first reference voltage VREF_A and the second reference voltage VREF_B is too wide, the pull-up resistance adjusting signal PCAL_UP and pull-down resistance adjusting signal NCAL_DQ can be placed between the first reference voltage VREF_A and the second reference voltage VREF_B within a predetermined time. However, in that case, the semiconductor device cannot exactly provide the pull-up calculating codes PCAL_UP<0:5> and the pull-down calculating codes NCAL_DN<0:5> corresponding to the ZQ resistance. Hence, it is important to optimally determine a target range between the first reference voltage VREF_A and the second reference voltage VREF_B.

SUMMARY OF THE INVENTION

Embodiments of the present invention are directed to providing an impedance adjusting circuit of semiconductor memory devices for being able to adjusting its termination resistance stably.

In accordance with an aspect of the present invention, a semiconductor memory device includes a reference range supplying unit for supplying a normal target range corresponding to a ZQ resistance and supplying a micro target range in response to a micro target signal, a termination resistance supplying unit for supplying an output resistance corresponding to a plurality of control codes, a code generating unit for generating the plurality of control codes in order to shift the output resistance within the normal target range and for adjusting the plurality of control codes to shift the output resistance within the micro target range in response to the micro target signal, and a normal shift detecting unit for detecting the output resistance arranged within the normal target range to generate the micro target signal.

In accordance with another aspect of the present invention, a semiconductor memory device includes a reference range supplying unit for supplying a normal target range corresponding to a ZQ resistance and supplying a micro target range in response to a micro target signal, a termination resistance supplying unit for supplying a pull-up output resistance corresponding to a plurality of pull-up control codes and for supplying a pull-down output resistance corresponding to a plurality of pull-down control codes, a pull-up code generating unit for generating the plurality of pull-up control codes in order to shift the pull-up output resistance within the normal target range thereby to generate a first hold signal in response to the generated pull-up control codes and for adjusting the plurality of pull-up control codes to shift the pull-up output resistance within the micro target range in response to the micro target signal, a pull-down code generating unit for generating the plurality of pull-down control codes in order to shift the pull-down output resistance within the normal target range thereby to generate a second hold signal in response to the generated pull-down control codes and for adjusting the plurality of pull-down control codes to shift the pull-down output resistance within the micro target range in response to the micro target signal, and a normal shift detecting unit for generating the micro target signal in response to the first hold signal and the second hold signal.

In accordance with further aspect of the present invention, a method for operating a semiconductor memory device includes supplying a normal target range corresponding to a ZQ resistance, supplying an output resistance corresponding to a plurality of control codes, generating the plurality of control codes in order to shift the output resistance within the normal target range, detecting the output resistance arranged within the normal target range to generate a micro target signal, supplying a micro target range in response to the micro target signal, and adjusting the plurality of control codes to shift the output resistance within the micro target signal

DESCRIPTION OF SPECIFIC EMBODIMENTS

Figure 1:
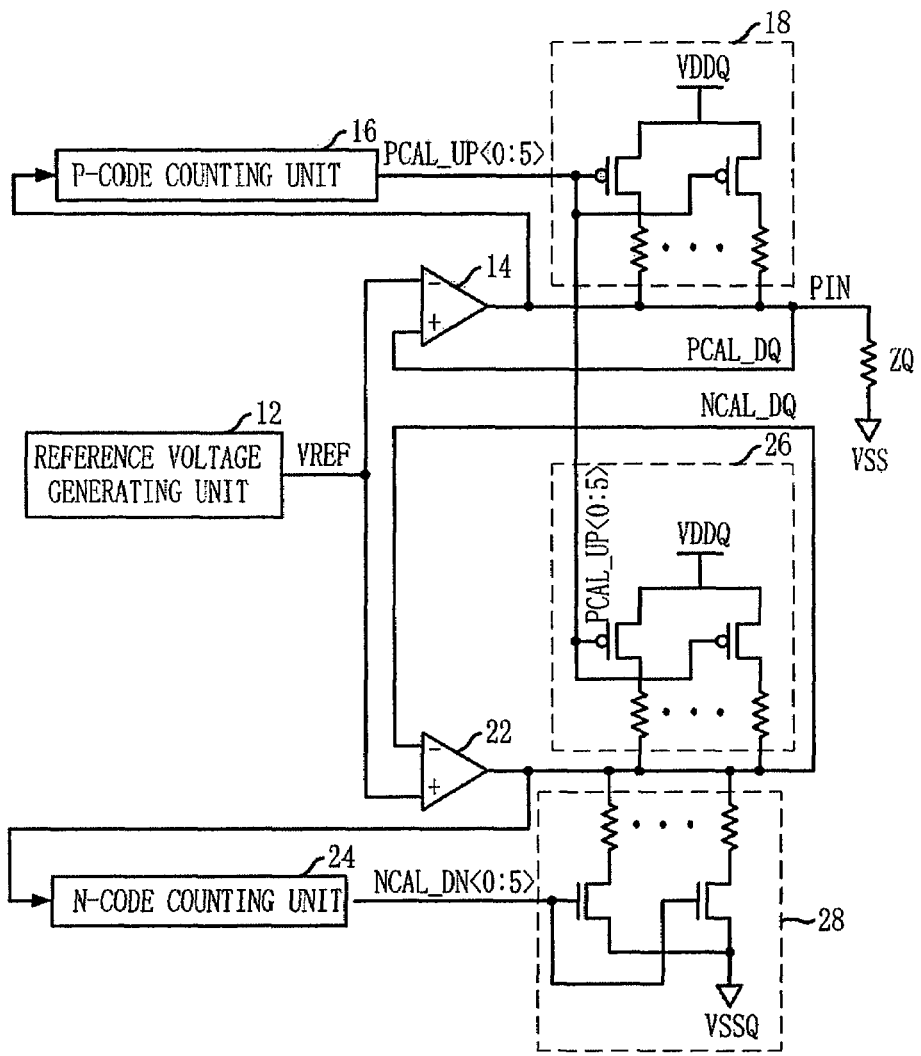
FIG. 1 shows a schematic diagram of a conventional ZQ calibration circuit in a semiconductor memory device.
Figure 2:
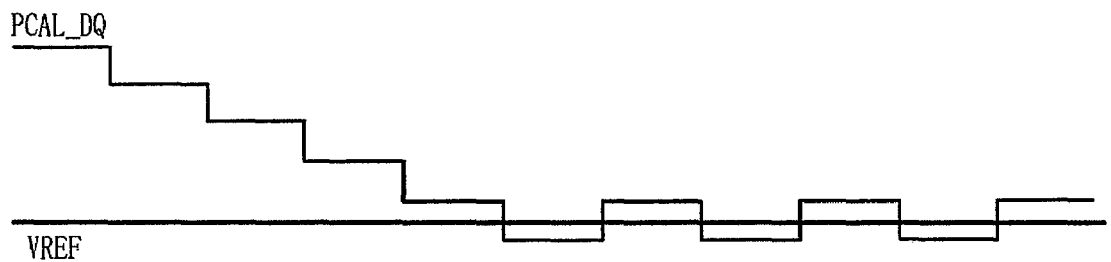
FIG. 2 shows an operation of the conventional ZQ calibration circuit in FIG. 1.
Figure 3:
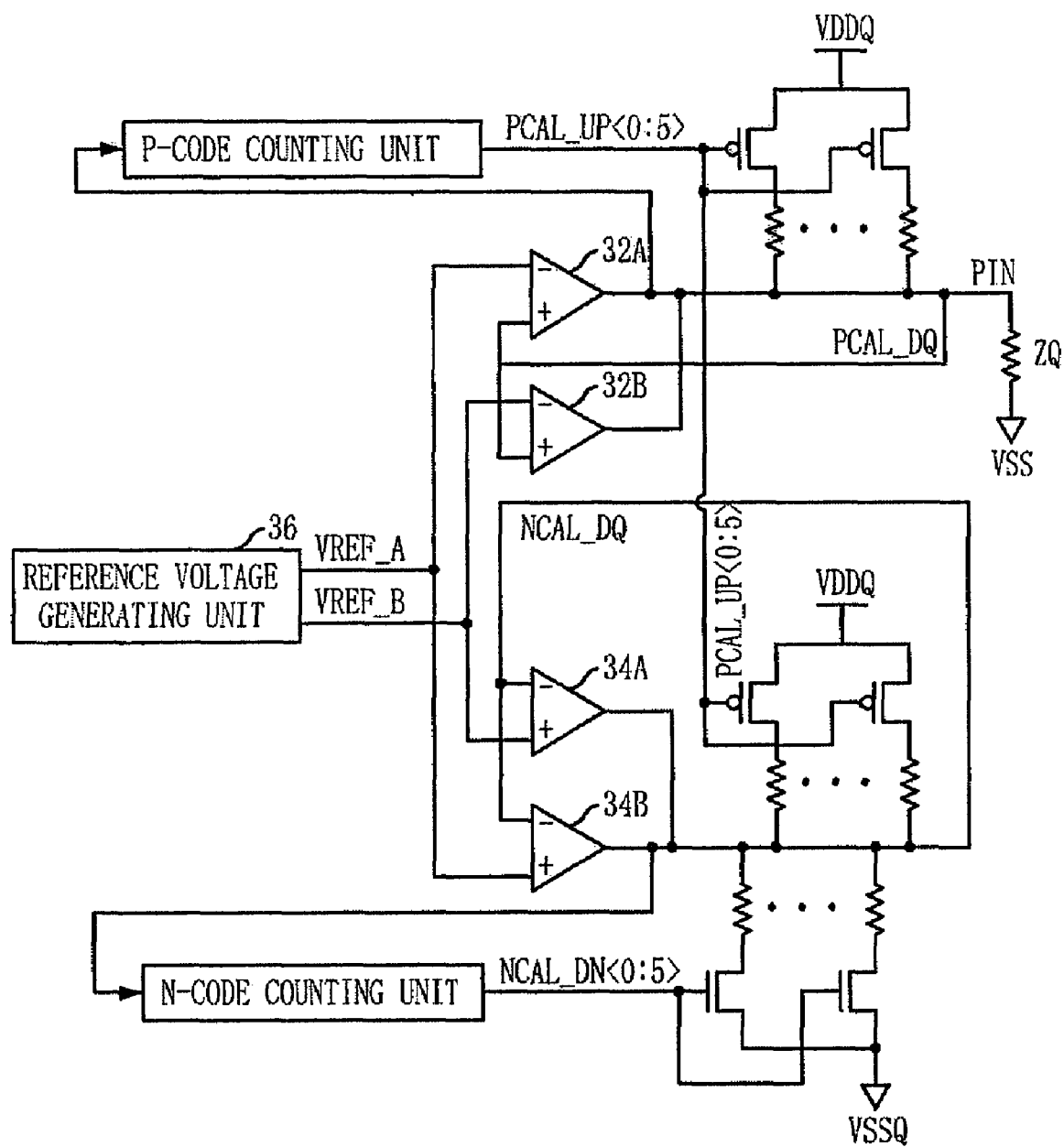
FIG. 3 shows a schematic diagram of another conventional ZQ calibration circuit in a semiconductor memory device.
Figure 4:
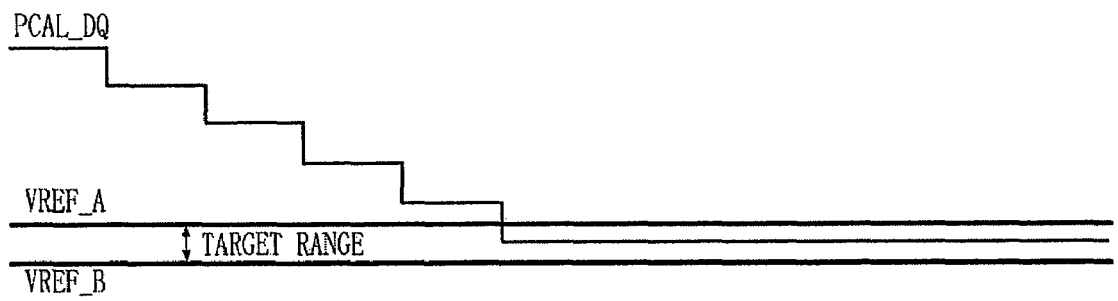
FIG. 4 shows an operation of the conventional ZQ calibration circuit in FIG. 3.
Figure 5:
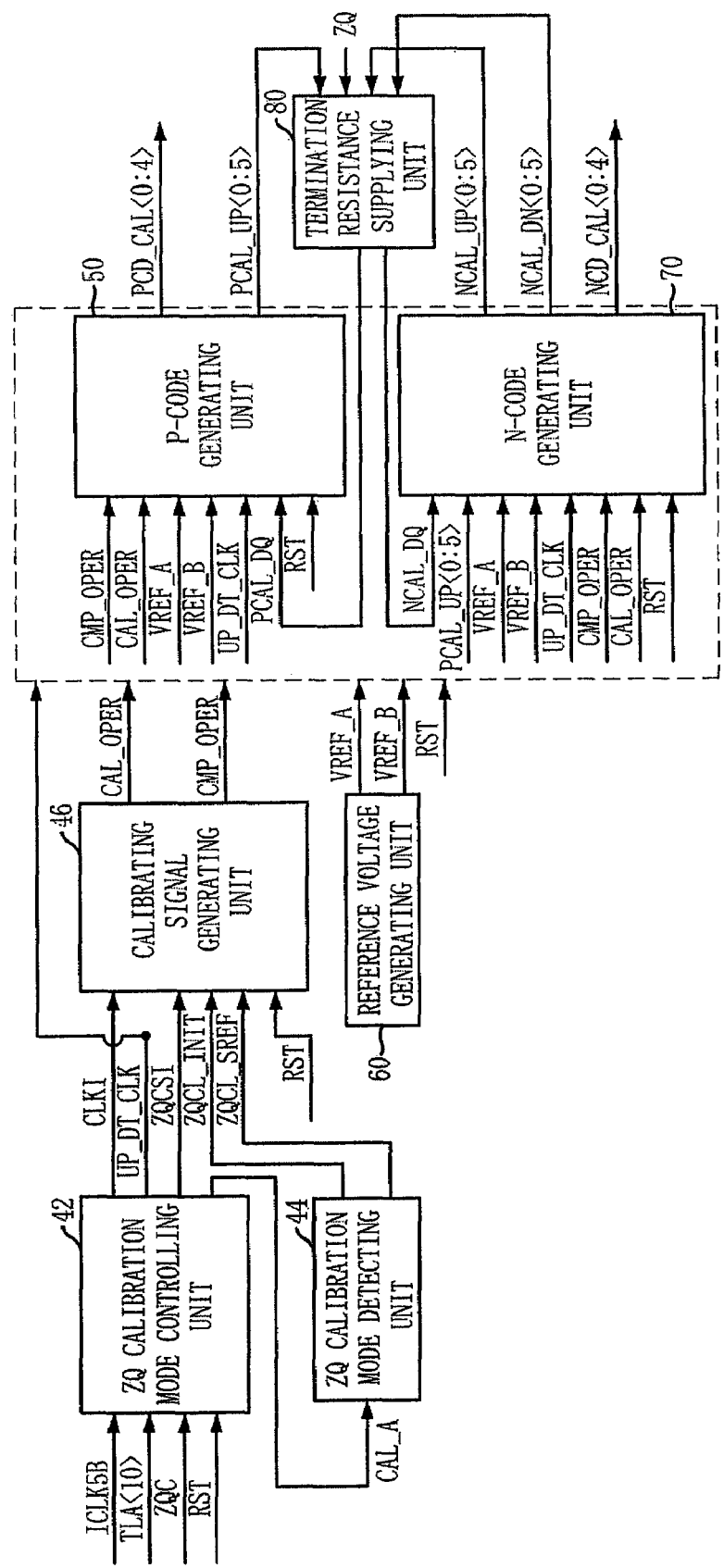
FIG. 5 shows a block diagram of another ZQ calibration circuit in a semiconductor memory device.
Figure 6:
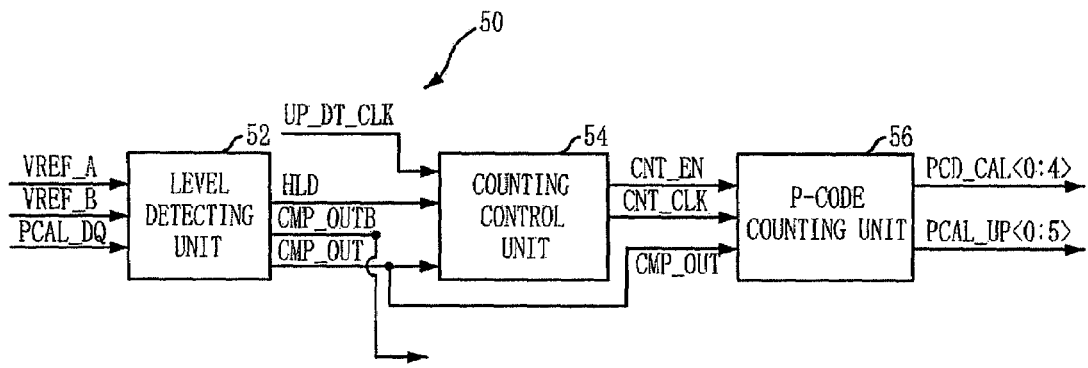
FIG. 6 shows a block diagram of a p-code generating unit in FIG. 5.
Figure 7:
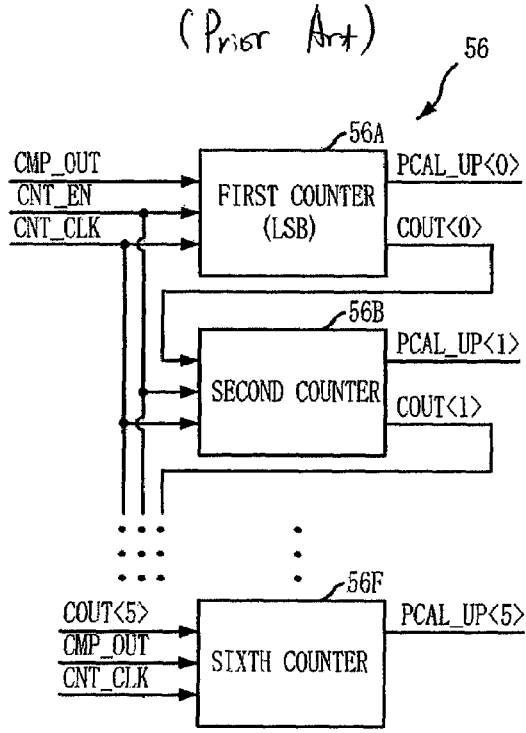
FIG. 7 shows a block diagram of a p-code counting unit in FIG. 6.
Figure 8:
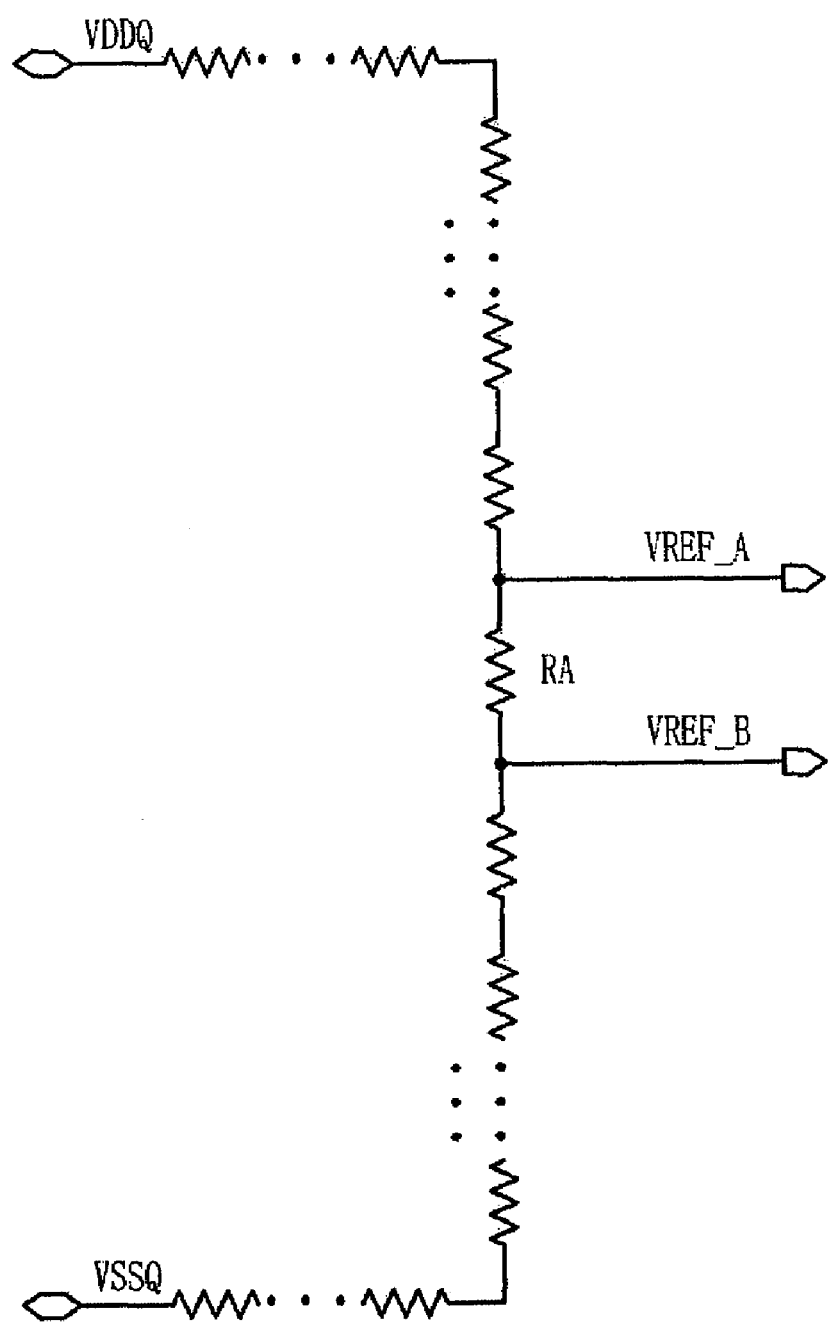
FIG. 8 shows a schematic diagram of a reference voltage generating unit in FIG. 5.
Figure 9A:
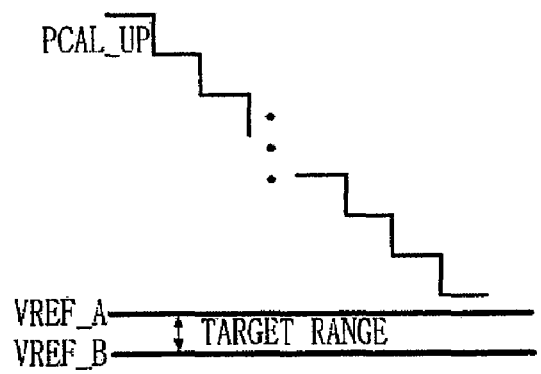
FIG. 9A shows an operation of the ZQ calibration circuit in FIG. 5 when the target voltage is narrow.
Figure 9B:
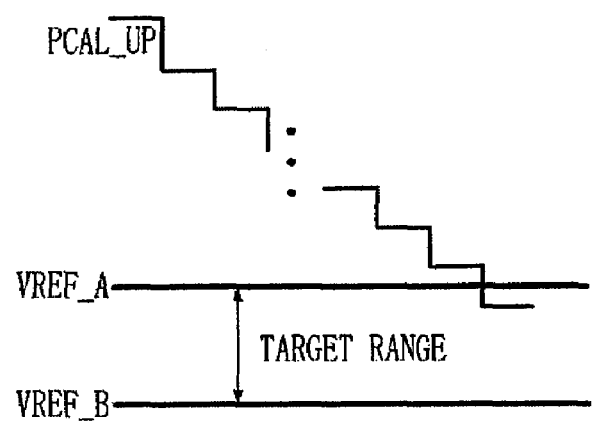
FIG. 9B shows an operation of the ZQ calibration circuit in FIG. 5 when the target voltage is wide.
Figure 10:
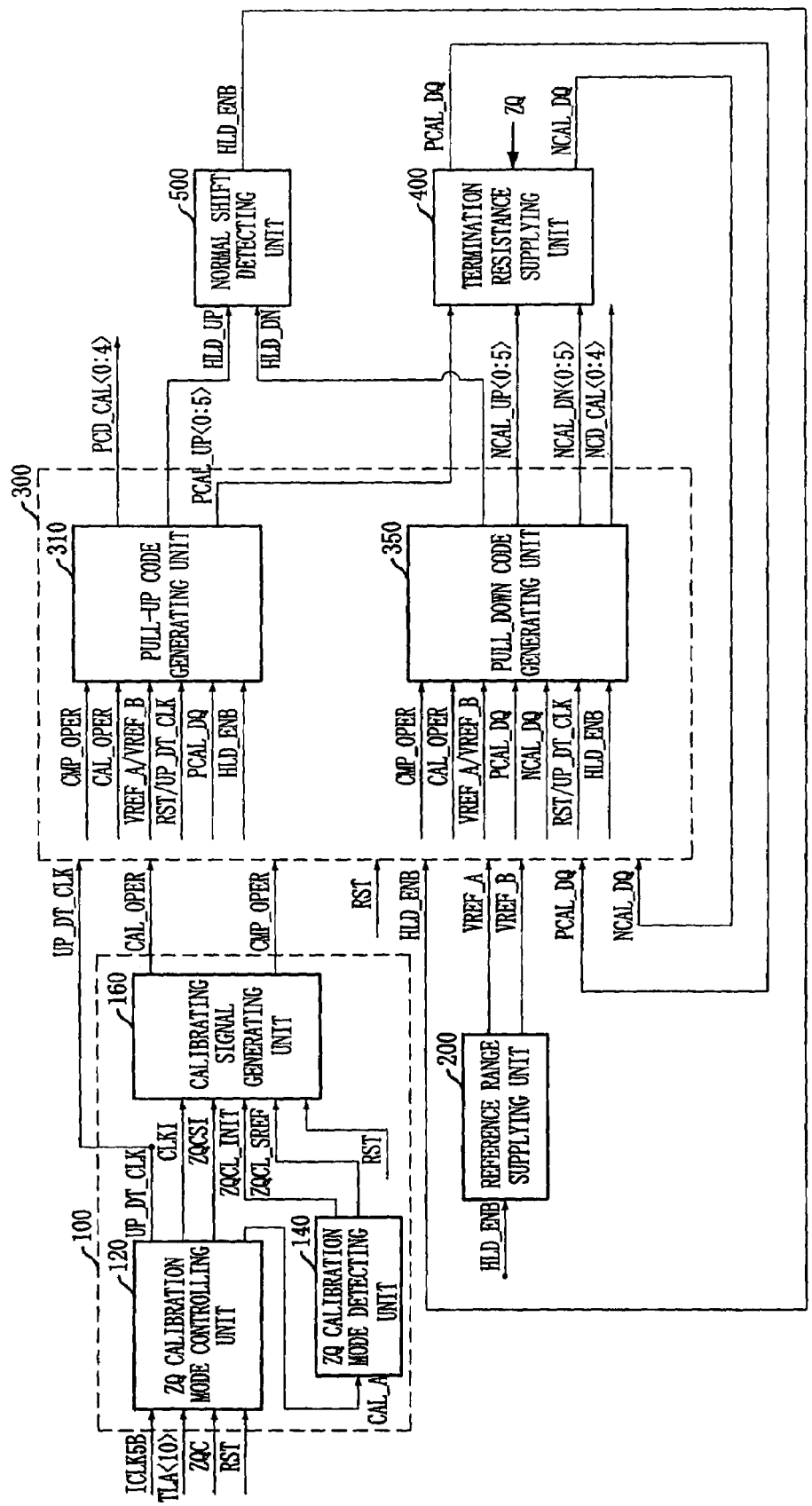
FIG. 10 shows an exemplary block diagram of a semiconductor memory device according to the present invention.

FIG. 10 shows an exemplary block diagram of a semiconductor memory device according to the present invention. The semiconductor memory device includes a resistance measurement control unit 100, a reference range supplying unit 200, a code generating unit 300, a termination resistance supplying unit 400 and a normal shift detecting unit 500.

The resistance measurement control unit 100 includes a ZQ calibration mode controlling unit 120, a ZQ calibration mode detecting unit 140 and a calibrating signal generating unit 160. The ZQ calibration mode controlling unit 120 generates a short-calibration signal ZQSCI and a long-calibration signal CAL_A in response to a reset signal RST, a ZQ adjusting signal ZQC and an address TLA<10>, and generates a clock signal CLKI and a clock signal UP_DT_CLK using an input clock ICLK5B. The clock signal CLKI is a signal for operating the calibrating signal generating unit 160. The ZQ calibration mode detecting unit 140 generates an initial calibration signal ZQCL_INIT in response to a first activation of the long-calibration signal CAL_A and generates a self-calibration signal ZQCL_SREF in response to the next activation of the long-calibration signal CAL_A. The calibrating signal generating unit 160 is activated in response to the initial calibration signal ZQCL_INIT, the self-calibration signal ZQCL_SREF, the short-calibration signal ZQSCI and the reset signal RST and generates a calibration operation signal CAL_OPER and a comparing operation CMP_OPER in synchronization with the clock signal CLKI periodically.

The reference range supplying unit 200 supplies a normal target range corresponding to a ZQ resistance and supplies a micro target range in response to a micro target signal HLD_ENB. The micro target range is in proportion to the normal target range. Both of the normal target range and the micro target range is provided using a first reference voltage VREF_A and a second reference voltage VREF_B.

The code generating unit 300 includes the pull-up code generating unit 310 and the pull-down code generating unit 350. The pull-up code generating unit 310 generates the plurality of pull-up control codes PCAL_UP<0:5> in order to shift the pull-up output resistance PCAL_DQ within the normal target range and generates a first hold signal HLD_UP in response to the generated pull-up control codes PCAL_UP<0:5> and adjusts the plurality of pull-up control codes PCAL_UP<0:5> to shift the pull-up output resistance PCAL_DQ within the micro target signal in response to the micro target signal HLD_ENB. The pull-down code generating unit 350 generates the plurality of pull-down control codes NCAL_DN<0:5> in order to shift the pull-down output resistance NCAL_DQ within the normal target range and generates a second hold signal HLD_DN in response to the generated pull-down control codes NCAL_DN<0:5>. Also, the pull-down code generating unit 350 adjusts the plurality of pull-down control codes NCAL_DN<0:5> to shift the pull-down output resistance within the micro target signal in response to the micro target signal HLD_ENB. The reset signal RST is a signal for reset operation of the ZQ calibration mode controlling unit 120. The pull-down code generating unit 350 receives the pull-up control codes PCAL_UP<0:5> and generates a replica pull-up control codes NCAL_UP<0:5> duplicated by the pull-up control codes PCAL_UP<0:5>. The clock signal UP_DT_CLK is a reference clock signal for counting the pull-down control codes NCAL_DN<0:5> and the pull-up control codes PCAL_UP<0:5>.

In order to generate the pull-up control codes PCAL_UP<0:5> and the pull-down control codes NCAL_DN<0:5> corresponding to the ZQ resistance, at first the pull-up code generating unit 310 generates the pull-up control codes PCAL_UP<0:5> and then, the pull-down code generating unit 350 generates the pull-down control codes NCAL_DN<0:5> on condition that the pull-up control codes PCAL_UP<0:5> are fixed. The pull-down code generating unit 350 uses the replica pull-up control codes NCAL_UP<0:5> for fixing the pull-up control codes PCAL_UP<0:5>.

Furthermore, result pull-up control codes PCD_CAL<0:4> and result pull-down control codes NCD_CAL<0:4> have the same digital value with the pull-up control codes PCAL_UP<0:4> and the pull-down control codes NCAL_DN<0:4>. The result pull-up control codes PCD_CAL<0:4> and the result pull-down control codes NCD_CAL<0:4> are codes for providing an output resistance adjusting circuit connected to an input/output pad. The output resistance adjusting circuit supplies a resistance value corresponding to the result pull-up control codes PCD_CAL<0:4> and the result pull-down control codes NCD_CAL<0:4> to the input/output pad.

The termination resistance supplying unit 400 supplies the pull-up output resistance corresponding to the pull-up control codes PCAL_UP<0:5> and supplies the pull-down output resistance corresponding to the pull-down control codes NCAL_DN<0:5>. The normal shift detecting unit 500 generates the micro target signal HLD_ENB in response to the first hold signal HLD_UP and the second hold signal HLD_DN.

Described above, the semiconductor device has two steps for generating the pull-up control codes PCAL_UP<0:5> and the pull-down control codes NCAL_DN<0:5> corresponding to the ZQ resistance. On the first step, the normal target range is a reference range for searching the pull-up control codes PCAL_UP<0:5> and the pull-down control codes NCAL_DN<0:5>. On the second step, the micro target range is a reference range for searching the pull-up control codes PCAL_UP<0:5> and the pull-down control codes NCAL_DN<0:5>. Unit levels of the pull-up control codes PCAL_UP<0:5> and the pull-down control codes NCAL_DN<0:5> on the first step are larger than those on the second step. In other words, a changing width of the pull-up control codes PCAL_UP<0:5> on the first step is larger than that of the pull-up control codes PCAL_UP<0:5> on the second step.

In another exemplify semiconductor device, the counting level of the pull-up control codes PCAL_UP<0:5> and the pull-down control codes NCAL_DN<0:5> can be changed depending on the first step or on the second step. That is, the pull-up control codes PCAL_UP<0:5> and the pull-down control codes NCAL_DN<0:5> on the first step can be counted by 2. Alternatively, the pull-up control codes PCAL_UP<0:5> and the pull-down control codes NCAL_DN<0:5> on the second step can be counted by 1.

Through two steps for generating the pull-up control codes PCAL_UP<0:5> and the pull-down control codes NCAL_DN<0:5> corresponding to the ZQ resistance, the semiconductor device can find an output resistance corresponding to a ZQ resistance and provide the output resistance for all output resistance adjusting circuits respectively connected to input/output pads, efficiently. Specifically, all output resistances of all input/output pads in the semiconductor device can be changed into the output resistance corresponding to the resistance value of the ZQ resistor ZQ.

Figure 11:
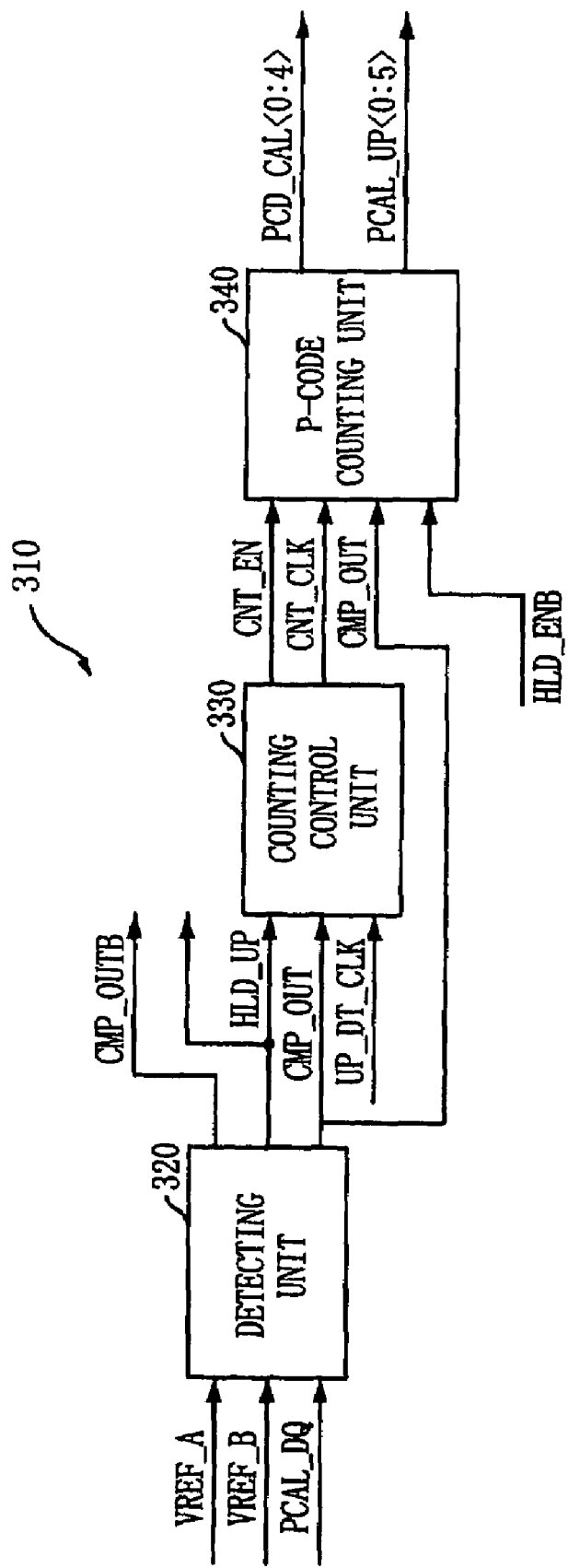
FIG. 11 shows a block diagram of a pull-up code generating unit in FIG. 10.

FIG. 11 shows a block diagram of the pull-up code generating unit 310 in FIG. 10. The pull-up code generating unit 310 includes a detecting unit 320, a counting control unit 330 and a p-code counting unit 340. The detecting unit 320 detects whether the pull-up output resistance PCAL_DQ is arranged within the normal target range or the micro target range determined by the first reference voltage VREF_A and the second reference voltage VREF_B. The counting control unit 330 provides the reference clock CNT_CLK and a counting enable signal CNT_EN using the clock signal UP_DT_CLK in response to a comparison signal CMP_OUT generated by the detecting unit 320 and the first hold signal HLD_UP. The p-code counting unit 340 is activated in response to the counting enable signal CNT_EN and counts the plurality of pull-up control codes PCAL_UP<0:5> and the result pull-up control codes PCD_CAL<0:4> in synchronization with a reference clock CNT_CLK in response to the comparison signal CMP_OUT.

In reference, the pull-down code generating unit 350 has substantially the same configuration with the pull-up code generating unit 310 except generating the pull-down control code NCAL_UP<0:5>. Hence, the detail expression of the pull-down code generating unit 350 will be omitted.

Figure 12:
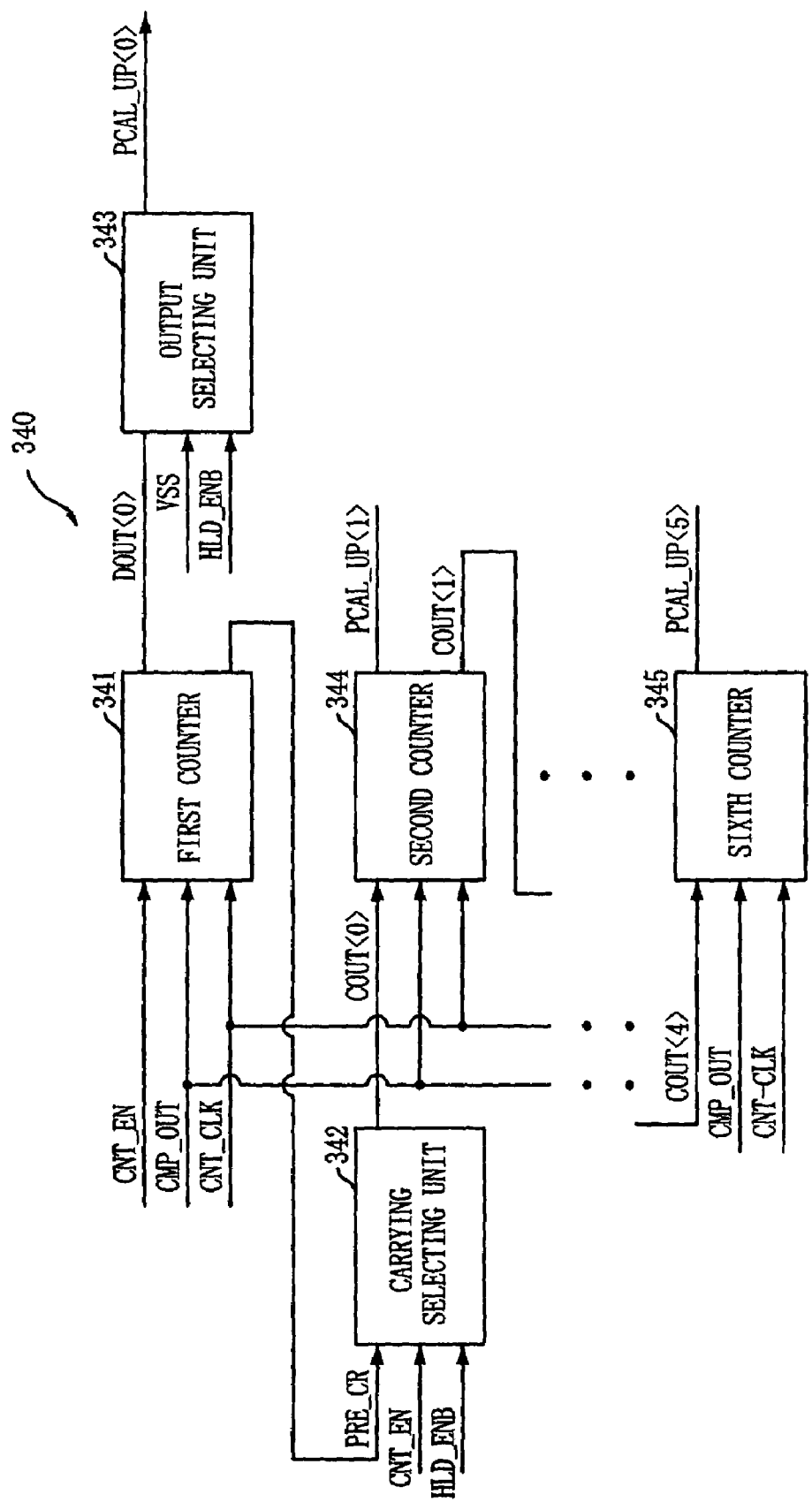
FIG. 12 shows a block diagram of a p-code counting unit in FIG. 11.

FIG. 12 shows a block diagram of the p-code counting unit 340 in FIG. 11. The p-code counting unit 340 includes a first counter 341, a carrying selecting unit 342, an output selecting unit 343, a second counter 344 and a sixth counter 345. The first counter 341 counts up or down a pre-carry signal PRE_CR and a pre-code signal DOUT<0> in synchronization with the reference clock CNT_CLK in response to a counting enable signal CNT_EN and the comparison signal CMP_OUT provided from the detecting unit 320. The carrying selecting unit 342 selects the pre-carry signal PRE_CR or the counting enable signal CNT_EN as a first carry signal COUT<0> in response to the micro target signal HLD_ENB. The output selecting unit 343 selects the pre-code signal DOUT<0> as a first pull-up code PCAL_UP<0> in response to the micro target signal HLD_ENB. The carrying selecting unit 342 selects the pre-carry signal PRE_CR or the counting enable signal CNT_EN as a first carry signal COUT<0> in response to the micro target signal HLD_ENB. The second counter 344 counts up or down a second carry signal COUT<1> and a second pull-up code PCAL_UP<1> in synchronization with the reference clock CNT_CLK in response to the comparison signal COM_PUT and the first carry signal COUT<0>. The sixth counter 345 counts up or down a sixth pull-up code PCAL_UP<5> in synchronization with the reference clock CNT_CLK in response to the comparison signal COM_PUT and the fifth carry signal COUT<4>.

Figure 13:
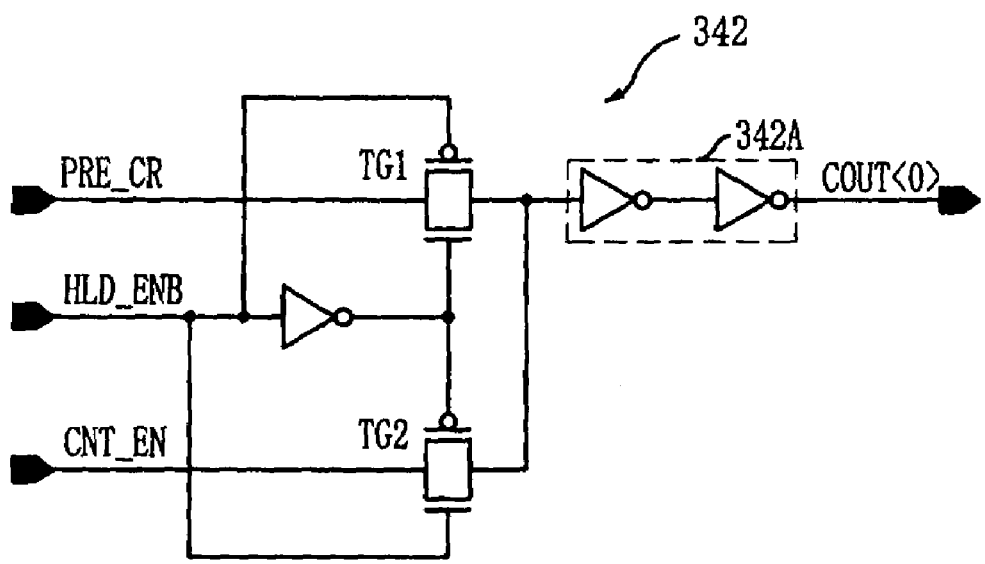
FIG. 13 shows a block diagram of a carry selecting unit in FIG. 12.

FIG. 13 shows a block diagram of the carrying selecting unit 342 in FIG. 12. The carrying selecting unit 342 includes a transmission gate TG1 for transferring the counting enable signal CNT_EN in response to an inactivation of the micro target signal HLD_ENB, a transmission gate TG2 for transferring the pre-carry signal PRE_OR in response to an activation of the micro target signal HLD_ENB and a first buffering unit 342A for buffering the signal transferred by the transmission gate TG1 or the transmission gate TG2 to output the first carry signal CUNT<0>. The carrying selecting unit 342 outputs the pre-carry signal PRE_OR as the first carry signal COUT<0> in response to an activation of the micro target signal HLD_ENB. If the micro target signal HLD_ENB is activated, the carrying selecting unit 342 outputs the counting enable signal CNT_EN as the first carry signal COUT<0> regardless of the pre-carry signal PRE_OR. During the micro target signal HLD_ENB is enabled, the first carry signal COUT<0> has a logic high level.

The carrying selecting unit 342 and the output selecting unit 343 have the same configuration except input signals. In detail, the output selecting unit 343 outputs the pre-code signal DOUT<0> as the first pull-up code PCAL_UP<0> in response to an activation of the micro target signal HLD_ENB. Also, the output selecting unit 343 outputs a logic level of ground voltage VSS as the first carry signal COUT<0> having a low logic level in response to an inactivation of the micro target signal HLD_ENB.

The operation of the pull-up code generating unit 310 will be described in case of an activation and an inactivation of the micro target range HLD_ENB. If the pull-up resistance is arranged within the normal target range determined by the reference voltages VREF_A and VREF_B, the detecting unit 320 activates the first hold signal HLD_UP. If the pull-up resistance is higher than the normal target range determined by the reference voltages VREF_A and VREF_B, the detecting unit 320 outputs the comparison signal CMP_OUT having a logic high level. Alternatively, if the pull-up resistance is lower than the normal target range determined by the reference voltages VREF_A and VREF_B, the detecting unit 320 outputs the comparison signal CMP_OUT having a logic low level.

The comparison signal CMP_OUT and the anti-comparison signal CMP_OUTB have an opposite logic level to each other. The counting control unit 330 activates the counting enable signal CNT_EN in response to the comparison signal CMP_OUT and generates the reference clock CNT_CLK using the clock signal UP_DT_CLK. If the pull-up resistance is arranged within the normal target range, the comparison signal CMP_OUT is inactivated and the first hold signal HLD_UP is activated. Then, the counting enable signal CNT_EN is inactivated in response to the activation of the first hold signal HLD_UP. Thus the reference clock CNT_CLK is not supplied into the p-code counting unit 340 in response to the inactivation of the counting enable signal CNT_EN.

In case of an activation of the micro target signal HLD_ENB, the p-code counting unit 340 counts up or down the pull-up control codes PCAL_UP<0:5> depending on the logic level of the comparison signal CMP_OUT in response to the activation of the counting enable signal CNT_EN. Herein, the counting of the pull-up control codes PCAL_UP<0:5> is synchronized with the reference clock CNT_CLK.

In case of an inactivation of the micro target signal HLD_ENB, since the first counter 341 outputs the pre-code signal DOUT<0> having a logic high level, the output selecting unit 343 outputs the first pull-up code PCAL_UP<0> having a logic high level. In other words, during the inactivation of the micro target signal HLD_ENB the first pull-up code PCAL_UP<0> is activated. The p-code counting unit 340 counts up or down the pull-up control-codes PCAL_UP<1:5> depending on the logic level of the comparison signal CMP_OUT in response to the activation of the counting enable signal CNT_EN on condition that the first pull-up code PCAL_UP<0> has a logic high level.

Therefore, the p-code counting unit 340 counts up or down the pull-up control codes PCAL_UP<0:5> by relatively a larger level in case of the inactivation of the micro target signal HLD_ENB than in case of the activation of the micro target signal HLD_ENB. As a result, the p-code counting unit 340 can count the pull-up control codes PCAL_UP<0:5> within the normal target range corresponding to the ZQ resistance quickly. Alternatively, the p-code counting unit 340 counts up or down the pull-up control codes PCAL_UP<0:5> by relatively a small level in case of the inactivation of the micro target signal HLD_ENB than in case of the activation of the micro target signal HLD_ENB. As a result, the p-code counting unit 340 can count the pull-up control codes PCAL_UP<0:5> within the micro target range, efficiently.

Figure 14:
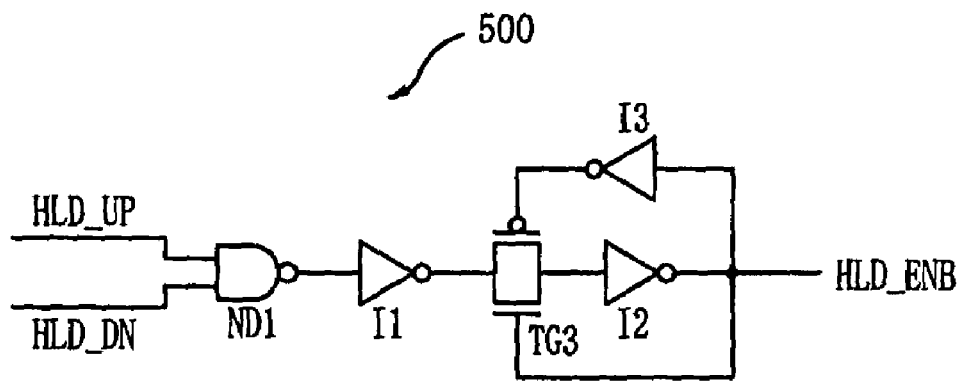
FIG. 14 shows a block diagram of a normal shift detecting unit in FIG. 10.

FIG. 14 shows a block diagram of the normal shift detecting unit 500 in FIG. 10. The normal shift detecting unit 500 includes a NAND logic gate ND1 for receiving the first hold signal HLD_UP and the second hold signal HLD_DN, a transmission gate TG3 for transferring an output of the NAND logic gate ND1 in response to the micro range signal HLD_ENB and an inverter I2 for inverting the signal transferred by the transmission gate TG3 to output the micro range signal HLD_ENB. The normal shift detecting unit 500 activates the micro range signal HLD_ENB in response to the activation of the first hold signal HLD_UP and the second hold signal HLD_DN. Once the micro range signal HLD_ENB is activated, the transmission gate TG3 is turned off. After turn-off of the transmission gate TG3, the micro range signal HLD_ENB maintains the state of the activation regardless of the activation of the first hold signal HLD_UP and the second hold signal HLD_DN.

Figure 15:
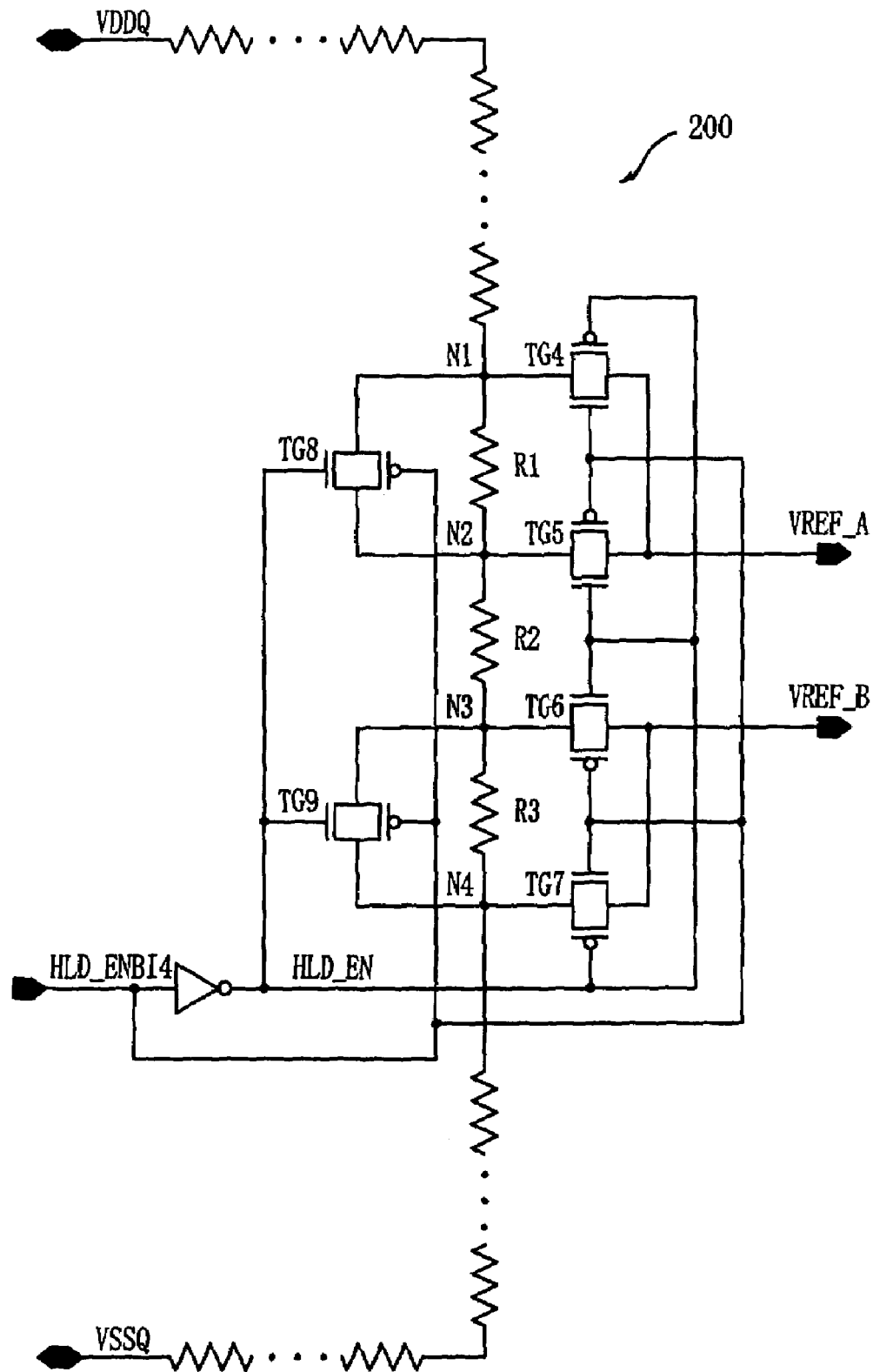
FIG. 15 shows a schematic diagram of a reference range supplying unit in FIG. 10.

FIG. 15 shows a schematic diagram of the reference range supplying unit 200 in FIG. 10. The reference range supplying unit 200 includes a plurality of voltage dividing units arranged between a first voltage VDDQ and a second voltage VSSQ in series and a reference range selecting unit for selecting voltage dividing units corresponding to the normal target range and selecting at least a voltage dividing unit corresponding to the micro target range HLD_ENB in response to the micro target signal wherein the micro target range is narrower than the normal target range.

The voltage dividing units include at least a resistor, each other. The reference range selecting unit includes transmission gates TG4 and TG7 for supplying a voltage level decided by a first to a third dividing units, e.g., R1, R2 and R3 selected among the plurality of voltage dividing units as the normal target range in response to an inactivation of the micro target signal HLD_ENB and transmission gates TG5 and TG6 for supplying a voltage level decided by a third voltage dividing unit, e.g., R2 selected among the plurality of voltage dividing units as the micro target range in response to an activation of the micro target signal HLD_ENB.

Also, the reference range supplying unit 200 further includes a level adjusting unit for adjusting the widths of the normal target range and the micro target range. The level adjusting unit includes a transmission gate TG8 for connecting the one node of the first voltage dividing unit, i.e., R1 to the other node of the voltage dividing unit in response to the micro target signal HLD_ENB and a transmission gate TG9 for connecting the one node of the third voltage dividing unit i.e., R3 to the other node of the second voltage dividing unit in response to the micro target signal HLD_ENB.

On condition that the inactivation of the micro target signal HLD_ENB, the reference range supplying unit 200 outputs voltages supplied by the resistors R1 and R3 as the first reference VREF_A and the second reference VREF_B, respectively. That is, the normal target range is decided by the voltages which are supplied by the resistors R1 and R3, respectively. On condition that the activation of the micro target signal HLD_ENB, the reference range supplying unit 200 outputs voltages supplied by each node of the resistor R3 as the first reference VREF_A and the second reference VREF_B, respectively. That is, the micro target range is decided by the voltages which are supplied by each node of the resistor R2. Especially, on condition that the activation of the micro target signal HLD_ENB, each node of the resistors R1 and R3 is shorted by a transmission gate TG8 and a transmission gate TG9.

Figure 16:
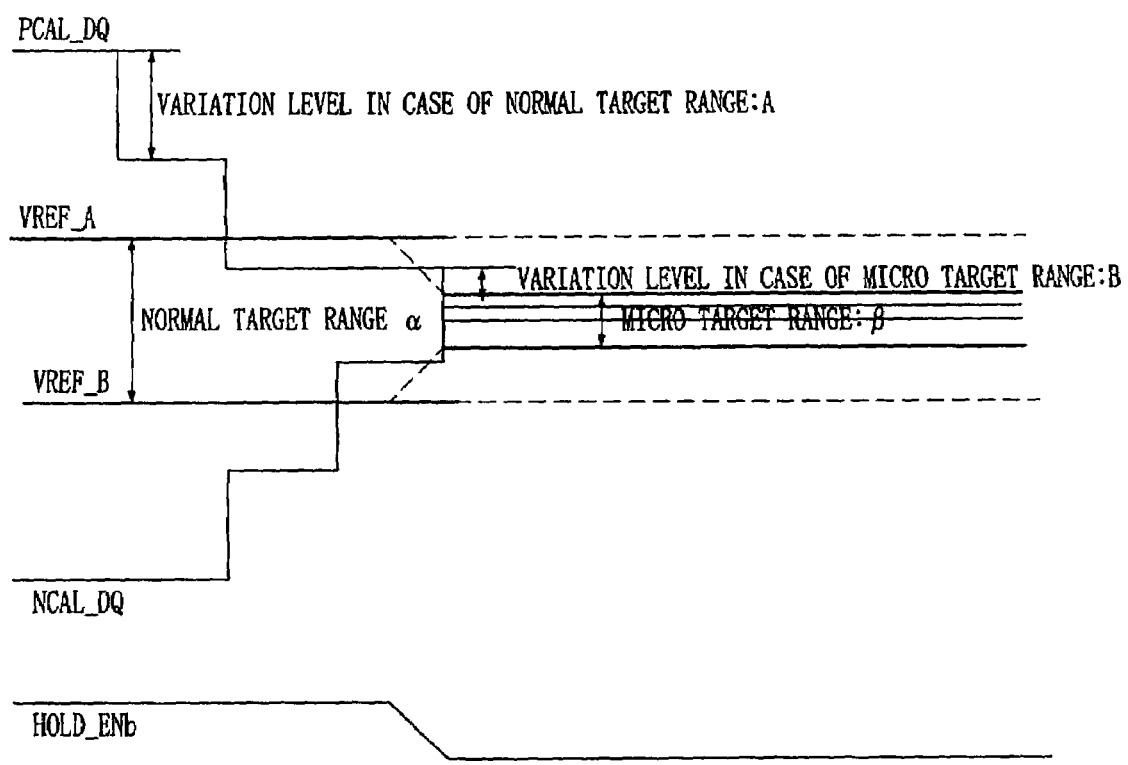
FIG. 16 shows an operation of the semiconductor memory device in FIG. 10.

FIG. 16 shows an operation of the semiconductor memory device in FIG. 10. The normal target range α is larger than the micro target range β. The variation level A when pull-up codes PCAL_UP<0:5> are counted under the normal target range α is larger than the variation level B when pull-down codes NCAL_DN<0:5> are counted under the micro target range β. The semiconductor memory device has two steps for generating the pull-up control codes PCAL_UP<0:5> and the pull-down control codes NCAL_DN<0:5> corresponding to the ZQ resistance. On the first step, the pull-up codes PCAL_UP<0:5> are counted by relatively a larger level in order to shift the pull-up resistance PCAL_DQ within the normal target range α. Hence, the semiconductor memory device spends relatively less time in searching the pull-up codes PCAL_UP<0:5> in order to shift the pull-up resistance PCAL_DQ within the normal target range α. On the second step, the pull-up codes PCAL_UP<0:5> are counted by relatively a small level in order to shift the pull-up resistance PCAL_DQ within the micro target range β. Since the micro target range β is included within the normal target range α, the semiconductor memory device can spend also less time in searching the pull-up codes PCAL_UP<0:5> in order to shift the pull-up resistance PCAL_DQ within the micro target range β. If the width of the micro target range β is reduced, the micro target range β can converge the ZQ resistance.

Therefore, if the widths of the normal target range α and the micro target range β are considered appropriately, the semiconductor memory device can exactly search the pull-up codes PCAL_UP<0:5> corresponding to the ZQ resistance within an efficient operating time. That is to say, the semiconductor memory device can reduce an operation time for searching the pull-up codes PCAL_UP<0:5> corresponding to the ZQ resistance and search accurately the pull-up codes PCAL_UP<0:5> corresponding to the ZQ resistance in accordance with the present invention. Although PVT variation, i.e., pressure, voltage, temperature variation, is occurred during the semiconductor memory device is operated, the semiconductor memory device can find out the pull-up codes PCAL_UP<0:5> and the pull-down codes NCAL_DN<0:5> corresponding to the ZQ resistance. The semiconductor memory device in accordance with the present invention can be expected to enhance reliability.

While the semiconductor memory device by the above description provides both of the pull-up codes PCAL_UP<0:5> and the pull-down codes NCAL_DN<0:5>, those skilled in the art are appreciated that either of the pull-up codes PCAL_UP<0:5> and the pull-down codes NCAL_DN<0:5> can be generated and the generated codes can be applied into searching a termination resistance.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a reference range supplying unit for supplying a normal target range corresponding to a ZQ resistance and supplying a micro target range in response to a micro target signal;
    a termination resistance supplying unit for supplying an output resistance corresponding to a plurality of control codes;
    a code generating unit for generating the plurality of control codes in order to shift the output resistance within the normal target range and for adjusting the plurality of control codes to shift the output resistance within the micro target range in response to the micro target signal; and
    a normal shift detecting unit for detecting the output resistance arranged within the normal target range to generate the micro target signal.

2. The semiconductor memory device of claim 1, wherein the normal target range is in proportion to the micro target range.

3. The semiconductor memory device of claim 1, wherein the reference range supplying unit includes:
    a plurality of voltage dividing units arranged between a first voltage and a second voltage in series; and
    a reference range selecting unit for selecting voltage dividing units corresponding to the normal target range and selecting at least a voltage dividing unit corresponding to the micro target range in response to the micro target signal wherein the micro target range is narrower than the normal target range.

4. The semiconductor memory device of claim 1, wherein the reference range supplying unit further includes a level adjusting unit for adjusting the width of the normal target range and the micro target range.

5. The semiconductor memory device of claim 1, wherein the code generating unit includes:
    a detecting unit for detecting whether the output resistance is arranged within the normal target range or the micro target range;
    a counting unit for counting the plurality of control codes in synchronization with a reference clock in response to the result of the detecting unit; and
    a counting control unit for providing the reference clock in response to the result of the detecting unit.

6. The semiconductor memory device of claim 5, wherein the counting unit changes a width of counting level or a counting level in response to the micro target signal.

7. The semiconductor memory device of claim 5, wherein the counting unit includes:
    a first counter for counting up or down a pre-carry signal and a pre-code signal in synchronization with the reference clock in response to a counting enable signal provided from the counting control unit and a comparison signal provided from the detecting unit;
    an output selecting unit for selecting the pre-code signal as a first output code in response to the micro target signal;
    a carrying selecting unit for selecting the pre-carry signal or the counting enable signal as a first carry signal;
    a second counter for counting up or down a second carry signal and a second code in synchronization with the reference clock in response to the counting enable signal and the first carry signal; and
    a third counter for counting up or down a third carry signal and a third code in synchronization with the reference clock in response to the counting enable signal and the second carry signal.

8. The semiconductor memory device of claim 7, wherein the carrying selecting unit includes:
    a first transmission gate for transferring the counting enable signal in response to an inactivation of the micro target signal;
    a second transmission gate for transferring the pre-carry signal in response to an activation of the micro target signal; and
    a first buffering unit for buffering the transferred signal by the first transmission gate or the second transmission gate to output the first carry signal.

9. The semiconductor memory device of claim 8, wherein the output selecting unit includes:
    a third transmission gate for transferring the pre-code signal in response to an inactivation of the micro target signal;
    a four transmission gate for transferring a signal having a logic low in response to an activation of the micro target signal; and
    a second buffering unit for buffering the transferred signal by the first transmission gate or the second transmission gate to output the first carry signal.

10. The semiconductor memory device of claim 9, wherein the normal shift detecting unit includes:
    a fifth transmission gate for transfer a normal shifting end signal in response to the micro range signal wherein the normal shifting end signal is generated by the code generating unit when the output resistance is shifted within the normal target range; and
    a first inverter for inverting the transferred signal by the fifth transmission gate to output the micro range signal.

11. The semiconductor memory device of claim 3, wherein the plurality of voltage dividing units includes at least a resistor.

12. The semiconductor memory device of claim 4, wherein the reference range selecting unit includes:
- a first and a second transmission gates for supplying a voltage level decided by a first and a second voltage dividing units selected among the plurality of voltage dividing units as the normal target range in response to inactivation of the micro target signal; and
- a third and a fourth transmission gates for supplying a voltage level decided by a third and a fourth voltage dividing units selected among the plurality of voltage dividing units as the micro target range in response to activation of the micro target signal.

13. The semiconductor memory device of claim 12, wherein the level adjusting unit includes:
- a fifth transmission gate for connecting the one node of the first voltage dividing unit to the other node of the first voltage dividing unit in response to micro target signal; and
- a sixth transmission gate for connecting the one node of the second voltage dividing unit to the other node of the second voltage dividing unit in response to the micro target signal.

14. The semiconductor memory device of claim 5, further including a resistance measurement control unit for providing a clock signal into the counting control unit and a control signal for controlling the code generating unit in response to a ZQ calibration signal.

15. A semiconductor memory device, comprising:
- a reference range supplying unit for supplying a normal target range corresponding to a ZQ resistance and supplying a micro target range in response to a micro target signal;
- a termination resistance supplying unit for supplying a pull-up output resistance corresponding to a plurality of pull-up control codes and for supplying a pull-down output resistance corresponding to a plurality of pull-down control codes;
- a pull-up code generating unit for generating the plurality of pull-up control codes in order to shift the pull-up output resistance within the normal target range thereby to generate a first hold signal in response to the generated pull-up control codes and for adjusting the plurality of pull-up control codes to shift the pull-up output resistance within the micro target range in response to the micro target signal;
- a pull-down code generating unit for generating the plurality of pull-down control codes in order to shift the pull-down output resistance within the normal target range thereby to generate a second hold signal in response to the generated pull-down control codes and for adjusting the plurality of pull-down control codes to shift the pull-down output resistance within the micro target range in response to the micro target signal; and
- a normal shift detecting unit for generating the micro target signal in response to the first hold signal and the second hold signal.

16. The semiconductor memory device of claim 15, wherein the normal target range is in proportion to the micro target range.

17. The semiconductor memory device of claim 15, wherein pull-up code generating unit includes:
- a detecting unit for detecting whether the pull-up output resistance is arranged within the normal target range or the micro target range;
- a counting unit for counting the plurality of pull-up control codes in synchronization with a reference clock in response to the result of the detecting unit; and
- a counting control unit for providing the reference clock in response to the result of the detecting unit.

18. The semiconductor memory device of claim 15, wherein the counting unit changes a width of counting level or a counting level in response to the micro target signal.

19. The semiconductor memory device of claim 17, wherein the counting unit includes:
- a first counter for counting up or down a pre-carry signal and a pre-code signal in synchronization with the reference clock in response to a counting enable signal provided from the counting control unit and a comparison signal provided from the detecting unit;
- an output selecting unit for selecting the pre-code signal as a first output code in response to the micro target signal;
- a carrying selecting unit for selecting the pre-carry signal or the counting enable signal as a first carry signal;
- a second counter for counting up or down a second carry signal and a second code in synchronization with the reference clock in response to the comparison signal and the first carry signal; and
- a third counter for counting up or down a third carry signal and a third code in synchronization with the reference clock in response to the comparison signal and the second carry signal.

20. The semiconductor memory device of claim 19, wherein the carrying selecting unit includes:
- a first transmission gate for transferring the counting enable signal in response to an inactivation of the micro target signal;
- a second transmission gate for transferring the pre-carry signal in response to an activation of the micro target signal;
- a first buffering unit for buffering the transferred signal by the first transmission gate or the second transmission gate to output the first carry signal.

21. The semiconductor memory device of claim 20, wherein the output selecting unit includes:
- a third transmission gate for transferring the pre-code signal in response to an inactivation of the micro target signal;
- a fourth transmission gate for transferring a signal having a logic low in response to an activation of the micro target signal;
- a second buffering unit for buffering the transferred signal by the first transmission gate or the second transmission gate to output the first carry signal.

22. The semiconductor memory device of claim 21, wherein the reference range supplying unit includes:
- a plurality of voltage dividing units arranged between a first voltage and a second voltage in series; and
- a reference range selecting unit for selecting voltage dividing units corresponding to the normal target range and selecting at least a voltage dividing unit corresponding to the micro target range in response to the micro target signal wherein the micro target range is narrower than the normal target range.

23. The semiconductor memory device of claim 22, wherein the reference range supplying unit further includes a level adjusting unit for adjusting the width of the normal target range and the micro target range.

24. The semiconductor memory device of claim 23, wherein the normal shift detecting unit include:
- an AND logic gate for receiving the first hold signal and the second hold signal;
- a fifth transmission gate for transferring an output of the NAND logic gate in response to the micro range signal; and a first inverter for inverting the transferred signal by the fifth transmission gate to output the micro range signal.

25. The semiconductor memory device of claim 24, wherein the plurality of voltage dividing units includes at least a resistor.

26. The semiconductor memory device of claim 24, wherein the reference range selecting unit includes:
- a sixth and a seventh transmission gates for supplying a voltage level decided by a first and a second voltage dividing units selected among the plurality of voltage dividing units as the normal target range in response to inactivation of the micro target signal; and
- an eighth and a ninth transmission gates for supplying a voltage level decided by a third and a fourth voltage dividing units selected among the plurality of voltage dividing units as the micro target range in response to activation of the micro target signal.

27. The semiconductor memory device of claim 26, wherein the level adjusting unit includes:
- a tenth transmission gate for connecting the one node of the first voltage dividing unit to the other node of the first voltage dividing unit in response to the micro target signal; and
- a eleventh transmission gate for connecting the one node of the second voltage dividing unit to the other node of the second voltage dividing unit in response to the micro target signal.

28. The semiconductor memory device of claim 17, further including a resistance measurement control unit for providing a clock signal into the counting control unit and a control signal for controlling the pull-up and pull-down code generating units in response to a ZQ calibration signal.

29. A method for operating a semiconductor memory device, comprising:
- supplying a normal target range corresponding to a ZQ resistance;
- supplying an output resistance corresponding to a plurality of control codes;
- generating the plurality of control codes in order to shift the output resistance within the normal target range;
- detecting the output resistance arranged within the normal target range to generate a micro target signal;
- supplying a micro target range in response to the micro target signal; and
- adjusting the plurality of control codes to shift the output resistance within the micro target signal.

30. The method of claim 29, wherein the normal target range is in proportion to the micro target range.

* * * * *